US009215832B2

(12) United States Patent
Chang et al.

(10) Patent No.: US 9,215,832 B2
(45) Date of Patent: Dec. 15, 2015

(54) LIQUID-COOLING MODULE AND ELECTRONIC DEVICE USING THE SAME

(71) Applicant: MSI Computer (Shenzhen) Co., Ltd., Shenzhen, Guangdong Province (CN)

(72) Inventors: Hung Chang, New Taipei (TW); Min-Lang Chen, New Taipei (TW)

(73) Assignee: MSI COMPUTER (SHENZHEN) CO., LTD., Shenzhen (CN)

( * ) Notice: Subject to any disclaimer, the term of this patent is extended or adjusted under 35 U.S.C. 154(b) by 209 days.

(21) Appl. No.: 14/061,133

(22) Filed: Oct. 23, 2013

(65) Prior Publication Data

US 2015/0070844 A1 Mar. 12, 2015

(30) Foreign Application Priority Data

Sep. 6, 2013 (TW) .............................. 102132314 A

(51) Int. Cl.
*H05K 7/20* (2006.01)

(52) U.S. Cl.
CPC ........ *H05K 7/20636* (2013.01); *H05K 7/20781* (2013.01)

(58) Field of Classification Search
CPC .......... H05K 7/20263; H05K 7/20272; H05K 7/20218; H05K 7/20636; H05K 7/20627; H05K 7/20781; H01L 23/473
USPC .............. 361/699, 701, 703; 165/80.4–80.5, 165/104.33; 257/714; 174/547
See application file for complete search history.

(56) References Cited

U.S. PATENT DOCUMENTS

| | | | |
|---|---|---|---|
| 6,955,212 B1* | 10/2005 | Hsieh ........................... 165/80.4 |
| 7,318,322 B2* | 1/2008 | Ota et al. ..................... 62/259.2 |
| 7,333,334 B2* | 2/2008 | Yamatani et al. ............. 361/701 |
| 7,484,552 B2* | 2/2009 | Pfahnl .......................... 165/80.4 |
| 7,626,815 B2* | 12/2009 | Stefanoski ............... 361/679.47 |
| 7,679,908 B2* | 3/2010 | Yeh et al. ...................... 361/695 |
| 2009/0116186 A1* | 5/2009 | Wei et al. ..................... 361/690 |
| 2014/0328021 A1* | 11/2014 | Tang ............................. 361/699 |

* cited by examiner

*Primary Examiner* — Zachary M Pape
(74) *Attorney, Agent, or Firm* — Maschoff Brennan

(57) ABSTRACT

A liquid-cooling module includes a liquid-providing component, a liquid-receiving component and at least one heat dissipating assembly. The liquid-providing component has a liquid inlet and a plurality of liquid-providing openings, while the liquid inlet is used for being connected to a cooler. The liquid-receiving component has a plurality of liquid-receiving openings and a liquid outlet, and the liquid outlet is used for being connected to the cooler. The at least one heat dissipating assembly includes a flow tube. One end of the flow tube is detachably connected to one of the plurality of liquid-providing openings, and the other end of the flow tube is connected on one of the plurality of liquid-receiving openings.

18 Claims, 6 Drawing Sheets

LIQUID-COOLING MODULE AND ELECTRONIC DEVICE USING THE SAME

CROSS-REFERENCE TO RELATED APPLICATIONS

This non-provisional application claims priority under 35 U.S.C. §119(a) on Patent Application No(s). 102132314 filed in Taiwan, R.O.C. on 2013 Sep. 6, the entire contents of which are hereby incorporated by reference.

TECHNICAL FIELD

The disclosure relates to a liquid-cooling module and an electronic device using the same, more particularly to a liquid-cooling module capable of adjusting its heat dissipating efficiency and an electronic device using the same.

BACKGROUND

In an electronic device's operation processes, the processing unit therein usually generates a large amount of heat as the computation that the processing unit executes increases. When the temperature of the processing unit is too high, however, it affects the computing efficiency negatively. Thus, effectively dissipating the heat of processing unit in order to avoid high temperature is an important issue for the related industries to deal with.

As for the present electronic device, fans therein are capable of blowing air into the processing unit to dissipate the heat in the electronic device. In addition, fans can also take away the air heated by the processing unit. Nonetheless, as the power and the number of the processing unit(s) in the electronic device increase, the above-mentioned air-cooled module is unable to deal with the requirements for the heat dissipation.

Therefore, for better heat dissipation, the liquid-cooling heat dissipating module is utilized in the electronic devices. The liquid in the liquid-cooling heat dissipating module absorbs the heat generated by the processing unit and the heat is dissipated through the flow of the liquid. However, when the power of the processing unit rises, it is possible that certain liquid-cooling heat dissipating modules are unable to cope with it. Thereby, these liquid-cooling heat dissipating modules have to be replaced or redesigned, which leads to inconvenience.

SUMMARY

A liquid-cooling module comprises a liquid-providing component, a liquid-receiving component and at least one heat dissipating assembly. The liquid-providing component has a liquid inlet and a plurality of liquid-providing openings, while the liquid inlet is configured for being connected to a cooler. The liquid-receiving component has a plurality of liquid-receiving openings and a liquid outlet, and the liquid outlet is configured for being connected to the cooler. The at least one heat dissipating assembly comprises a flow tube. One end of the flow tube is detachably connected to one of the plurality of liquid-providing openings, and the other end of the flow tube is connected on one of the plurality of liquid-receiving openings.

Moreover, an electronic device, comprises a case, a tray disposed in the case, a heat source disposed in the tray, a cooler disposed in the tray and in thermal contact with the heat source and a liquid-cooling module. The liquid-cooling module comprises a liquid-providing component, a liquid-receiving component and at least one heat dissipating assembly. The liquid-providing component has a liquid inlet and a plurality of liquid-providing openings, while the liquid inlet is configured for being connected to a cooler. The liquid-receiving component has a plurality of liquid-receiving openings and a liquid outlet, and the liquid outlet is configured for being connected to the cooler. The at least one heat dissipating assembly comprises a flow tube. One end of the flow tube is detachably connected to one of the plurality of liquid-providing openings, and the other end of the flow tube is connected on one of the plurality of liquid-receiving openings.

BRIEF DESCRIPTION OF THE DRAWINGS

The disclosure will become more fully understood from the detailed description given herein below and the drawings are for illustration only, and thus do not limit the present disclosure, wherein.

DETAILED DESCRIPTION

Figure 1:
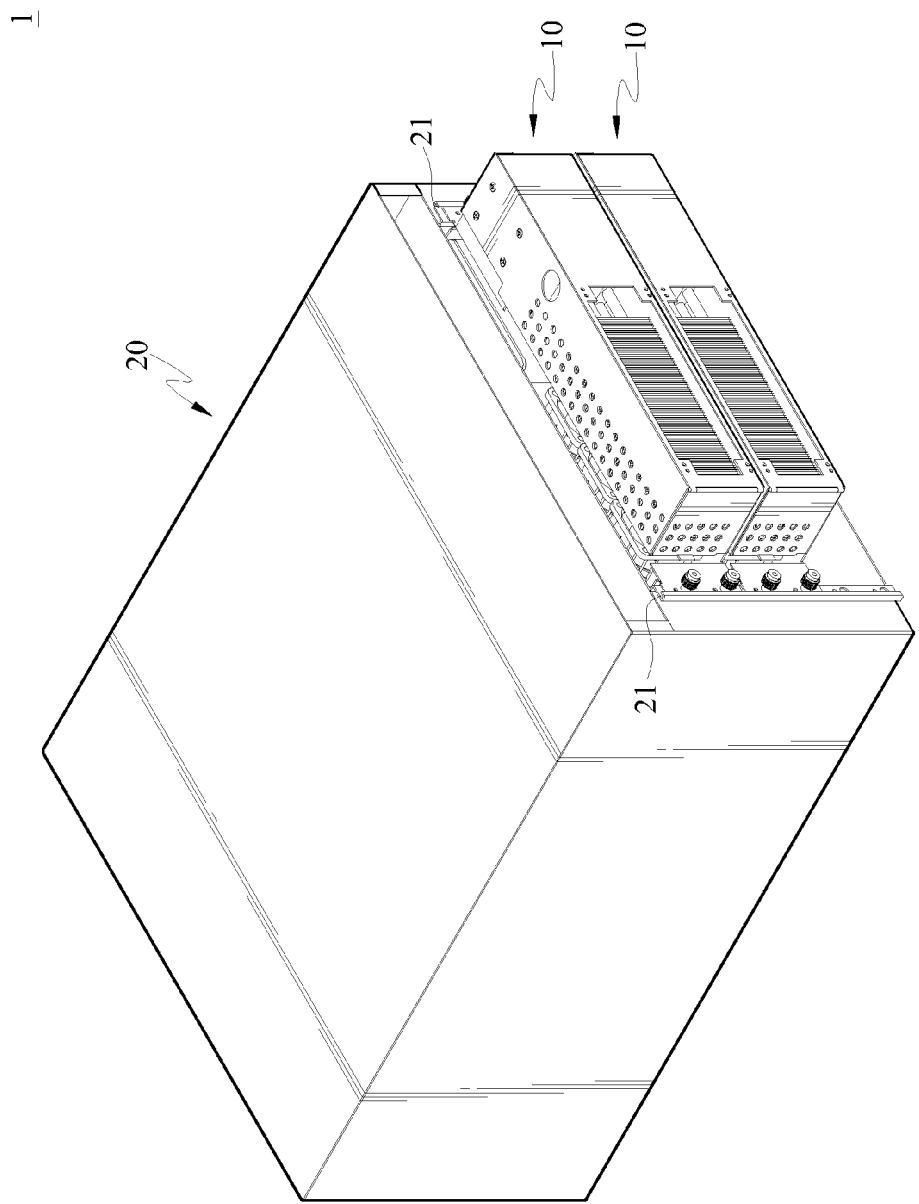
FIG. 1 is a perspective view of an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
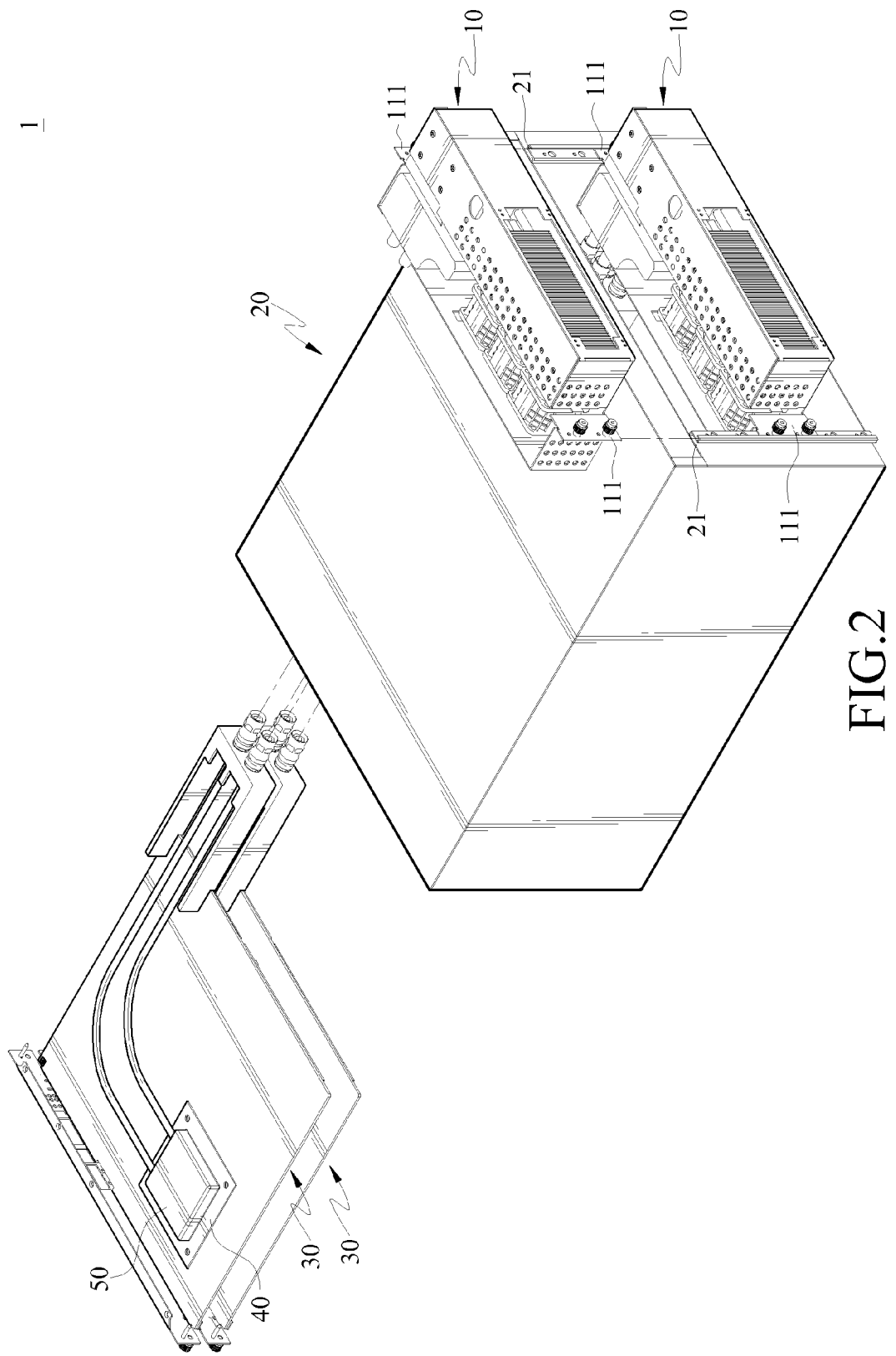
FIG. 2 is an exploded view of the electronic device in FIG. 1.
Figure 3:
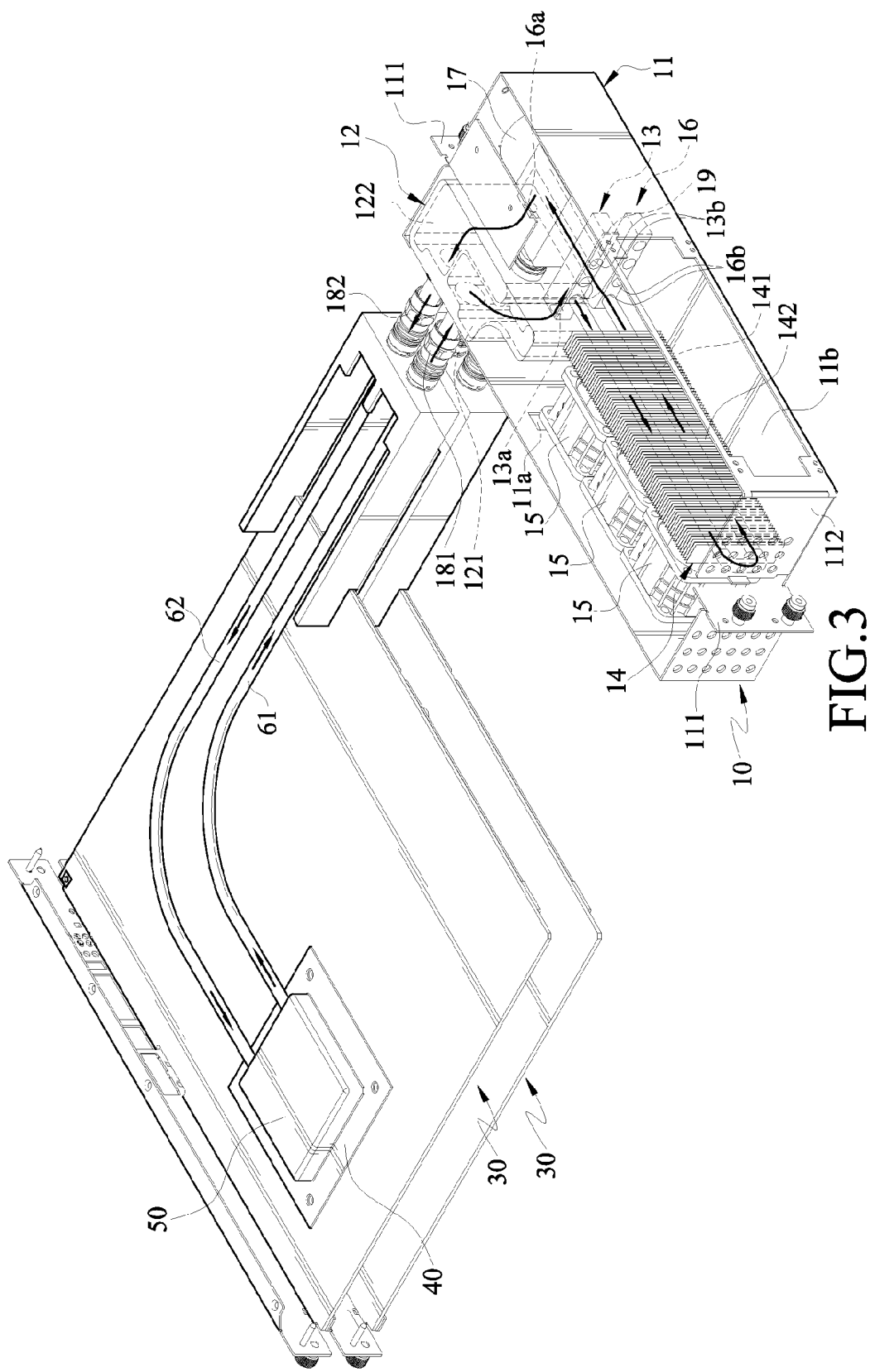
FIG. 3 is a perspective view of components of electronic device.

FIG. 1 is a perspective view of an electronic device according to an embodiment of the disclosure; FIG. 2 is an exploded view of the electronic device in FIG. 1; FIG. 3 is a perspective view of components of electronic device. As seen in FIG. 1 to FIG. 3, in this embodiment, the electronic device 1 comprises two liquid-cooling module 10, a case 20, six trays 30, six heat sources 40, six coolers 50, six first tubes 61 and six second tubes 62. In this embodiment, the heat source 40 is a central processing unit.

Each tray 30 is disposed in the case 20 while each heat source 40 is disposed in each tray 30. Each cooler 50 is disposed in each tray 30 and is in thermal contact with each heat source 40. Each first tube 61 and each second tube 62 are respectively connected to the cooler 50. That is, for example, each cooler 50 has a channel therein, and each first tube 61 and each second tube 62 are connected to the opposite ends of the channel of each cooler 50. The case has a rail 21 located on one side of the case 20.

In this embodiment, each liquid-cooling module 10 corresponds to two trays 30, two heat sources 40, two coolers 50, two first tubes 61 and two second tubes 62, but the disclosure is not limited thereto. In some other embodiments, each liquid-cooling module 10 may correspond to one tray 30, one heat source 40, one cooler 50, one first tube 61 and one second tube 62. Or, in some other embodiments, each liquid-cooling module 10 may correspond to more than two trays 30, two heat sources 40, two coolers 50, two first tubes 61 and two second tubes 62.

Figure 4:
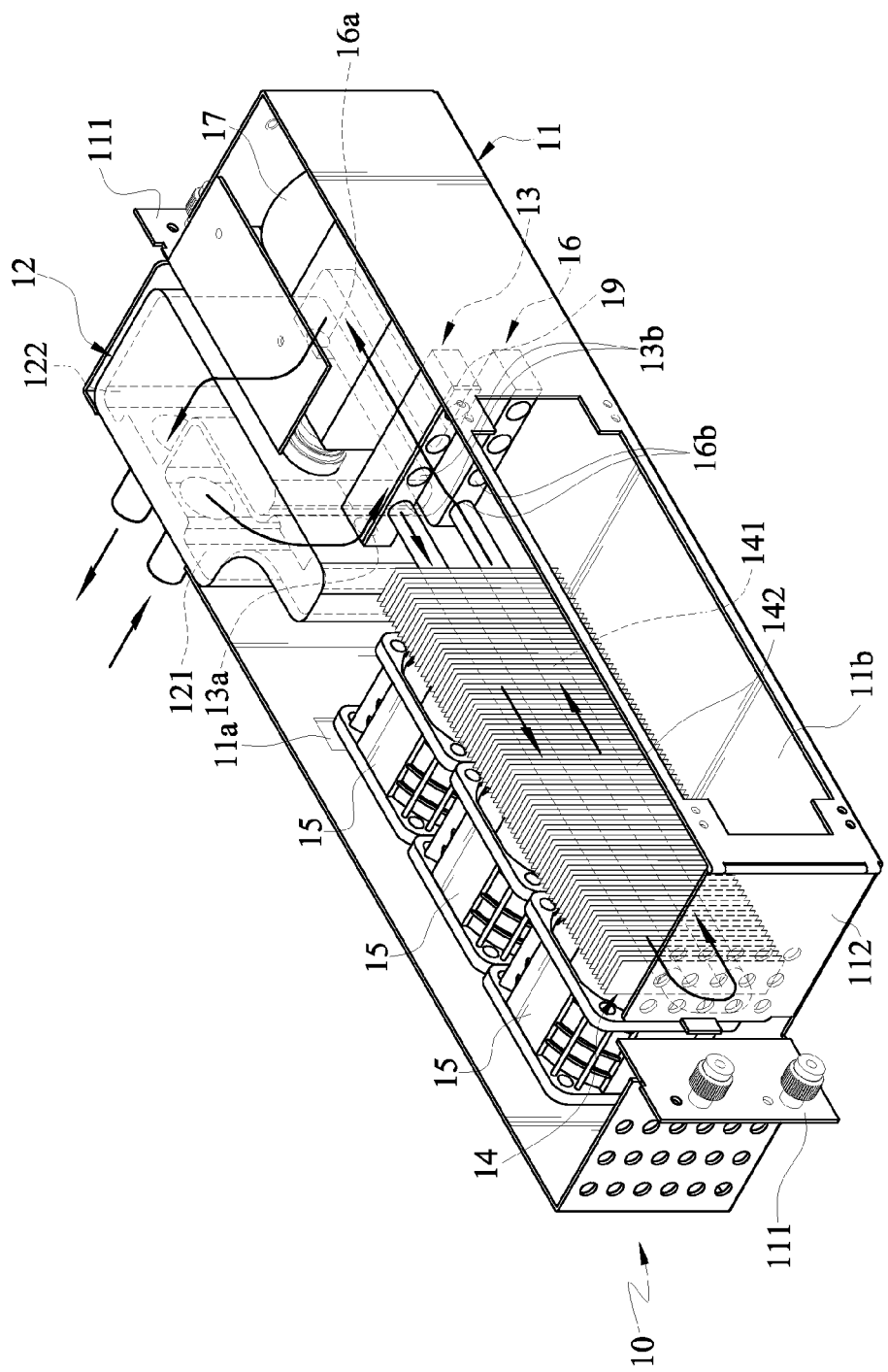
FIG. 4 is a perspective view of a liquid cooling module in FIG. 3.

FIG. 4 is a perspective view of a liquid cooling module in FIG. 3. As seen in FIG. 2 to FIG. 4, each liquid-cooling module 10 is disposed on the case 20 and is located on one side of the tray 30. Each liquid-cooling module 10 comprises a housing 11, a liquid tank 12, a liquid-providing component 13, a diverter valve 19, at least one heat dissipating assembly 14, a plurality of airflow generators 15, a liquid-receiving component 16, a liquid pump 17, two first connectors 181 and two second connectors 182. In this embodiment, the airflow generator 15 is a fan.

The liquid tank 12, the liquid-providing component 13, the heat dissipating assembly 14, the airflow generator 15, the liquid-receiving component 16 and the liquid pump 17 are all disposed in the case 20. The first connector 181 and the second connector 182 are installed on the housing 11, and are connected to the liquid tank 12. The housing 11 comprises an installation part 111 and a door 112, and has an air inlet 11a and an air outlet 11b. The installation part 111 is located on the lateral side of the housing 11. The installation part 111 is installed on the rail 21 so that the liquid-cooling module 10 can be vertically installed on the case 20 from the top of the case 20 towards the bottom of the case 20 downward (shown in FIG. 2). The tray 30 and the heat source 40, the cooler 50, the first tube 61 and the second tube 62 disposed therein can be horizontally plugged into the case 20 from one side of the case 20 towards the opposite side of the case 20. Moreover, the first connector 181 connects the first tube 61 and the liquid tank 12, and the second connector 182 connects the second tube 62 and the liquid tank 12.

The door 112 is located on one side of the housing 11 and is located on outside of the case 20. When the door 112 is open, it exposes the liquid-providing opening 13b of the liquid-providing component 13 and the liquid-receiving opening 16b of the liquid-receiving component 16. The airflow generator 15 is disposed on the heat dissipating assembly 14 for dissipating the heat of the heat dissipating assembly 14. The heat dissipating assembly 14 and the airflow generator 15 are disposed between the air inlet 11a and the air outlet 11b. In this embodiment, the heat dissipating assembly 14 is between the airflow generator 15 and the air outlet 11b, but the disclosure is not limited thereto. In other embodiments, the positions of the heat dissipating assembly 14 and the airflow generator 15 can be exchanged.

The liquid tank 12 is used for storing the heat dissipating liquid. The liquid tank 12 is divided into a first chamber 121 and a second chamber 122. The first connector 181 connects the first tube 51 and the first chamber 121, so that the first tube 61 connects the first chamber 121 and the cooler 50. The second connector 182 connects the second tube 62 and the second chamber 122, so that the second tube 62 connects the second chamber 122 and the cooler 50.

The liquid-providing component 13 has a liquid inlet 13a and a plurality of liquid-providing openings 13b. The liquid-receiving component 16 has a plurality of liquid-receiving openings 16b and a liquid outlet 16a. The liquid tank 12 is disposed at the liquid inlet 13a and the liquid outlet 16a. The first chamber 121 of the liquid tank 12 and the first connector 181 connect the first tube 61 with the liquid inlet 13a of the liquid-providing component 13, so that the liquid inlet 16a connects to the cooler 50. The second chamber 122 of the liquid tank 12 and the second connector 182 connect the first tube 62 with the liquid outlet 16a of the liquid-receiving component 16, so that the liquid outlet 16a connects to the cooler 50. The diverter valve 19 is disposed in the liquid-providing component 13.

Each heat dissipating assembly 14 comprises a flow tube 141 and fins 142. The opposite ends of the flow tube 141 are connected to one of the liquid-providing openings 13b and one of the liquid-receiving openings 16b, respectively. Since the liquid-cooling module 10 has multiple liquid-providing openings 13b and multiple liquid-receiving openings 16b, multiple heat dissipating assemblies 14 can be installed on them. One or more liquid-providing openings 13b without heat dissipating assembly 14 and one or more liquid-receiving openings 16b without heat dissipating assembly 14 can be blocked by closed valve(s). As for one or more liquid-providing openings 13b with the heat dissipating assembly 14 and one or more liquid-receiving openings 16b with the heat dissipating assembly 14, valves can be open for the heat dissipating liquid to flow. The diverter valve 19 is used for splitting the heat dissipating liquid into the liquid-providing openings 13b with the heat dissipating assembly 14. The fins 142 are disposed on the flow tube 141 and are in thermal contact with the flow tube 141.

In this embodiment, the flow tube 141 is in U shape. The fins 142 are arranged along a perpendicular direction, and two lateral sides of the U-shape tube 141 penetrate the fins 142, respectively. The bottom side of the U-shape tube 141 is parallel to the fins 142. In another embodiment, however, the flow tube 141 is in U shape; the fins 142 are arranged along an oblique direction; two lateral sides and the bottom side of the U-shape penetrate the fins 142. In other embodiment, the flow tube 141 is in U shape; the fins 142 are arranged along a horizontal direction; two lateral sides of the U-shape tube are parallel to the fins 142, and the bottom side of the U-shape is perpendicular to the fins 142. In other embodiment, the flow tube 141 is made of multiple U-shape tubes connected in a staggered up and down. In another embodiment, the number of flow tubes 141 is plural, and each liquid-providing opening 13b can split the heat dissipating liquid into the flow tubes 141. Each liquid-providing opening 13b can split the heat dissipating liquid into the flow tubes 141, while each liquid-receiving opening 16b can return the heat dissipating liquid in the flow tubes 141 to the liquid-receiving component 16.

The liquid pump 17 is disposed in the liquid tank 12 and the liquid outlet 16a. The liquid pump 17 is configured for making the heat dissipating liquid flow through the liquid inlet 13a, the liquid-providing component 13, the liquid-providing opening 13b, the flow tube 141, the liquid-receiving opening 16b, the liquid-receiving component 16 and the liquid outlet 16a, in sequence, to the cooler 50 and then return to the liquid inlet 13a. In other embodiments, the liquid pump 17 can be disposed on the liquid inlet 13a to make the heat dissipating liquid flow through the liquid inlet 13a, the liquid-providing component 13, the liquid-providing opening 13b, the flow tube 141, the liquid-receiving opening 16b, the liquid-receiving component 16 and the liquid outlet 16a, in sequence, to the cooler 50 and then return to the liquid inlet 13a.

During the operation of the electronic device 1, the heat source 40 generates heat. The liquid pump 16 drives the heat dissipating liquid in the second chamber 122 of the liquid tank 12 to the second tube 62 via the second connector 182. Cold heat dissipating liquid, therefore, flows to the cooler 50, and the heat dissipating liquid in the cooler 50 absorbs the heat of the heat source 40. Thus, the temperature of the heat dissipating liquid rises, while the temperature of the heat source 40 drops accordingly. Hot heat dissipating liquid leaves the cooler 50 via the first tube 61, and then flows to the first chamber 121 of the liquid tank 12 via the first connector 181.

Hot heat dissipating liquid in the first chamber 121 flows to the liquid-providing component 13 via the liquid inlet 13a, and then it flows to the flow tube 141 via the liquid-providing opening 13b. The fins 142 are in thermal contact with the flow tube 141 for dissipating the heat of the heat dissipating liquid in the flow tube 141. The airflow generator 15 inhales cold heat dissipating airflow from the air inlet 11a for blowing the fins 142. After being heated by the fins 142, the heat dissipating airflow flows out of the electronic device 1 via the air outlet 11b, so as to dissipate the heat of the fins 142 transferred by the heat dissipating liquid. Thereby, the heat dissipating liquid flowing through the flow tube 141 lowers its temperature and then flows to the liquid-receiving component 16 via the liquid-receiving opening 16b. Cold heat dissipating liquid in the liquid-receiving component 16 then flows to the second chamber 122 of the liquid tank 12. By the circulation of the heat dissipating liquid illustrated above, the heat generated by the heat source 40 is dissipated out of the electronic device.

However, when the power of the heat source 40 increases, it results in the fact that one heat dissipating assembly is not enough to dissipate the heat generated by the heat source 40. To solve this problem, the user may install another heat dissipating assembly on the liquid-cooling module 10.

Figure 5A:
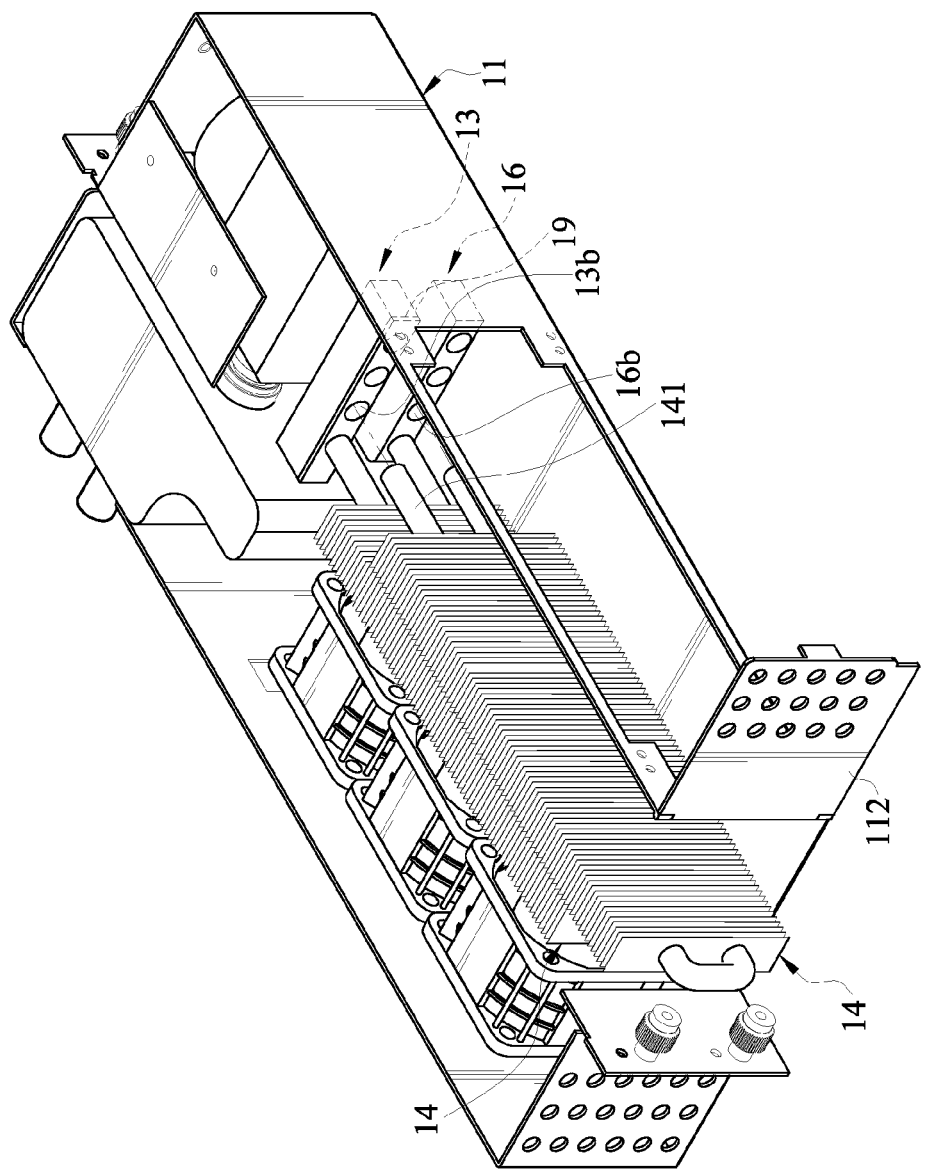
FIG. 5A and FIG. 5B are perspective views of the installation of the heat dissipating assembly on the liquid-cooling module.
Figure 5B:
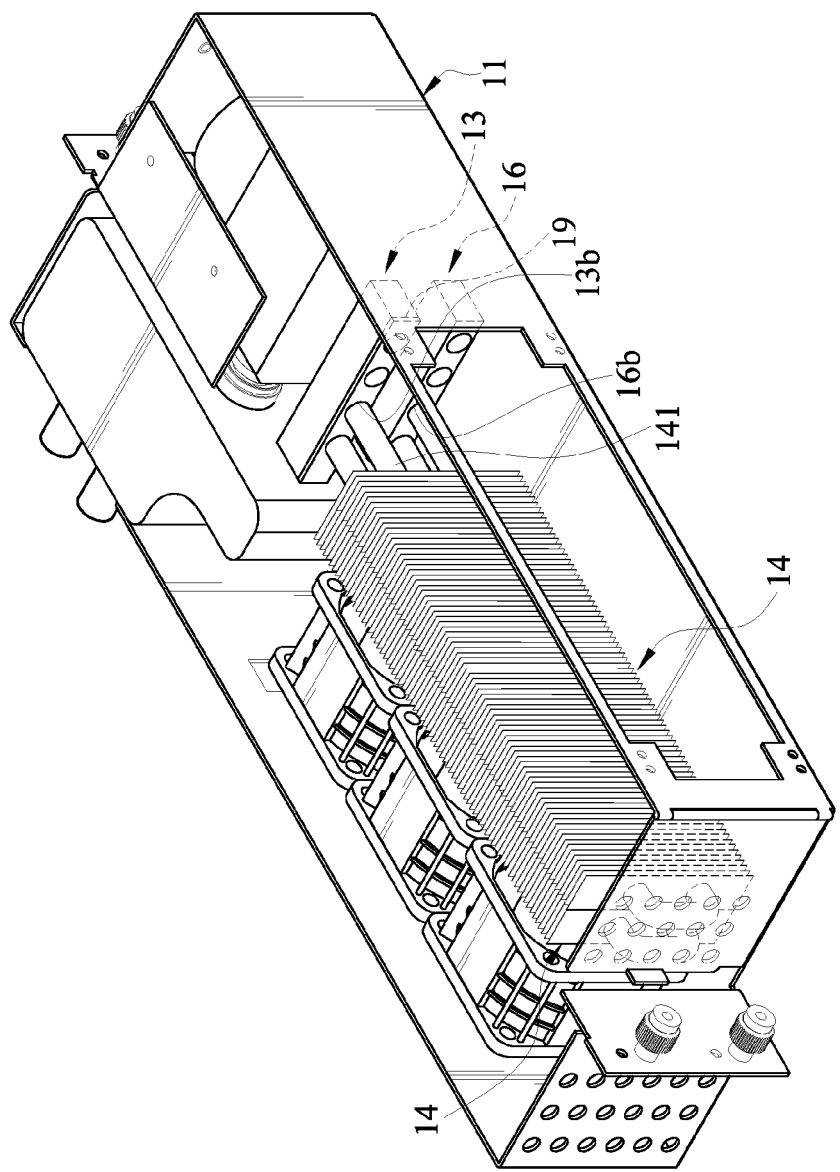

FIG. 5A and FIG. 5B are perspective view of the installation of the heat dissipating assembly on the liquid-cooling module. As seen in FIG. 5A, A user may open the door 112 and plug another heat dissipating assembly 14 in the case 11 via the opening exposed by the door 112. As seen in FIG. 5B, the user may then make the tube 141 of the heat dissipation assembly 14 connect one of the liquid-providing openings 13b of the liquid-providing component 13 with one of the liquid-receiving openings 16b of the liquid-receiving component 16. In this embodiment, two heat dissipating assemblies 14 are adjacent to each other but they are not limited thereto. That is, in other embodiments, two heat dissipating assemblies 14 are separated by a distance. For instance, the liquid-providing component 13 and the liquid-receiving component 16 can have four liquid-providing openings 13b and four liquid-receiving openings 16b, respectively. The first heat dissipating assembly 14 may be installed on one of the four liquid-providing openings 13b and one of the four liquid-receiving openings 16b, while the second heat dissipating assembly 14 may be installed on one of the other three liquid-providing openings 13b and one of the other three liquid-receiving openings 16b. Additionally, the number of the liquid-providing openings 13b and the liquid-receiving openings 16b may be greater than or equal to the number of the heat dissipating assembly 14. The installation positions of the heat dissipating assemblies 14 may be arranged based on users' demands. When two heat dissipating assemblies 14 are not enough to dissipate the heat of the heat source 40, more heat dissipating assemblies 14 can be employed. Moreover, users may remove heat dissipating assemblies 14 via the door 112 when the power of the heat source 40 decreases. Meanwhile, valves in the liquid-providing opening 13b and the liquid-receiving opening 16b where the heat dissipating assembly 14 has been removed can be closed manually or automatically, thereby preventing the outflow of the heat dissipating liquid.

According to the disclosure, in the liquid-cooling module and the electronic device using the same, the tube of the heat dissipating assembly is detachably disposed on one of the liquid-providing openings and one of the liquid-receiving openings, so that the number of the heat dissipating assemblies of the liquid-cooling module is varied based on the requirements regarding heat dissipation of the electronic device. When the power of the heat source increases, the number of the heat dissipating assemblies installed may be increased in order to improve the heat dissipating efficiency of the liquid-cooling module. On the other hand, when the power of the heat source decreases, the number of the heat dissipating assemblies installed may be reduced. Furthermore, the number of liquid-cooling modules may be changed based on the demands.

What is claimed is:

1. A liquid-cooling module comprising;
   a liquid-providing component having a liquid inlet and a plurality of liquid-providing openings, the liquid inlet being configured for being connected to a cooler;
   a diverter valve disposed in the liquid-providing component for splitting a heat dissipating liquid to the plurality of liquid-providing openings equipped with the liquid-providing component;
   a liquid-receiving component having a plurality of liquid-receiving openings and a liquid outlet, the liquid outlet being configured for being connected to the cooler; and
   at least one heat dissipating assembly comprising a flow tube, one end of the flow tube being detachably connected to one of the plurality of liquid-providing openings, and the other end of the flow tube being connected on one of the plurality of liquid-receiving openings.

2. The liquid-cooling module according to claim 1, wherein the at least one heat dissipating assembly further comprises a plurality of fins disposed on the flow tube and in thermal contact with the flow tube.

3. The liquid-cooling module according to claim 1, further comprising an airflow generator disposed on the at least one heat dissipating assembly for dissipating the heat generated by the at least one heat dissipating assembly.

4. The liquid-cooling module according to claim 1, further comprising a liquid pump connected to the liquid inlet or on the liquid outlet for driving a heat dissipating liquid to flow to the liquid outlet via the liquid inlet, each of the liquid-providing openings, the flow tube and each of the colleting liquid-receiving openings in sequence.

5. The liquid-cooling module according to claim 1, further comprising a liquid tank connected the liquid inlet or the liquid outlet for storing a heat dissipating liquid.

6. The liquid-cooling module according to claim 1, further comprising a housing, wherein the liquid-providing component, the liquid-receiving component and the at least one heat dissipating assembly are disposed inside the housing, and the housing has an installation part configured for being installed to one side of a case.

7. The liquid-cooling module according to claim 1, further comprising a housing, wherein the liquid-providing component, the liquid-receiving component and the at least one heat dissipating assembly are disposed inside the housing, the housing has a door located on one side of the housing, and when the door is open, the door exposes the plurality of liquid-providing openings and the plurality of liquid-receiving openings.

8. The liquid-cooling module according to claim 1, wherein the number of the heat dissipating assemblies is plural.

9. A electronic device, comprising:
   a case;
   a tray disposed in the case;
   a heat source disposed in the tray;
   a cooler disposed in the tray and in thermal contact with the heat source; and
   a liquid-cooling module comprising;
      a liquid-providing component having a liquid inlet and a plurality of liquid-providing openings, the liquid inlet being configured for being connected to a cooler;
      a diverter valve disposed in the liquid-providing component for splitting a heat dissipating liquid to the plurality of liquid-providing openings equipped with the liquid-providing component;

a liquid-receiving component having a plurality of liquid-receiving openings and a liquid outlet, the liquid outlet being configured for being connected to the cooler; and at least one heat dissipating assembly comprising a flow tube, one end of the flow tube being detachably connected to one of the plurality of liquid-providing openings, and the other end of the flow tube being connected on one of the plurality of liquid-receiving openings.

10. The electronic device according to claim 9, wherein the at least one heat dissipating assembly further comprises a plurality of fins disposed on the flow tube and in thermal contact with the flow tube.

11. The electronic device according to claim 9, wherein the liquid-cooling module further comprises an airflow generator disposed on the at least one heat dissipating assembly, wherein the airflow generator is configured for dissipating the heat generated by the at least one heat dissipating assembly.

12. The electronic device according to claim 9, wherein the liquid-cooling module further comprises a liquid pump connected to the liquid inlet or the liquid outlet for making a heat dissipating liquid flow to the liquid outlet via the liquid inlet, each of the liquid-providing openings, the flow tube and each of the liquid-receiving openings in sequence.

13. The electronic device according to claim 9, wherein the liquid-cooling module further comprises a liquid tank connected to the liquid inlet or the liquid outlet, and the liquid tank being configured for storing a heat dissipating liquid.

14. The electronic device according to claim 9, wherein the liquid-cooling module further comprises a housing, wherein the liquid-providing component, the liquid-receiving component and the at least one heat dissipating assembly are disposed inside the housing, and the housing has an installation part installed to one side of the case.

15. The electronic device according to claim 14, wherein the case further has a rail located on one side of the case, and the installation part of the housing is installed on the rail.

16. The electronic device according to claim 9, wherein the liquid-cooling module further comprises a housing, wherein the liquid-providing component, the liquid-receiving component and the at least one heat dissipating assembly are disposed inside the housing, the housing has a door located on one side of the housing, and when the door is open, the door exposes the plurality of liquid-providing openings and the plurality of liquid-receiving openings.

17. The electronic device according to claim 9, further comprising a first tube and a second tube, the first tube connecting the cooler and the liquid-providing component, and the second tube connecting the cooler and the liquid-receiving component.

18. The electronic device according to claim 9, wherein the number of the heat dissipating assemblies is plural.

* * * * *